United States Patent
Yeager

(10) Patent No.: US 6,774,160 B2
(45) Date of Patent: Aug. 10, 2004

(54) CURABLE EPOXY RESIN COMPOSITIONS AND THE CURED RESIDUES THEREOF

(75) Inventor: Gary W. Yeager, Rexford, NY (US)

(73) Assignee: General Electric Company, Pittsfield, MA (US)

( * ) Notice: Subject to any disclaimer, the term of this patent is extended or adjusted under 35 U.S.C. 154(b) by 138 days.

(21) Appl. No.: 09/683,880

(22) Filed: Feb. 27, 2002

(65) Prior Publication Data

US 2002/0111398 A1 Aug. 15, 2002

Related U.S. Application Data

(62) Division of application No. 09/393,772, filed on Sep. 10, 1999, now Pat. No. 6,387,990.

(51) Int. Cl.$^7$ .............................. C08K 5/06; C08L 63/02
(52) U.S. Cl. ....................... 523/456; 523/461; 525/391; 525/396; 525/530; 525/533; 528/118; 528/418; 528/421
(58) Field of Search ................................ 523/456, 461; 525/391, 396, 530, 533; 528/118, 418, 421

(56) References Cited

U.S. PATENT DOCUMENTS

| | | |
|---|---|---|
| 2,444,536 A | 7/1948 | Searle |
| 3,590,042 A | 6/1971 | Cyba |
| 3,595,900 A | 7/1971 | Loudas et al. |
| 3,733,349 A | 5/1973 | Loudas et al. |
| 3,962,184 A | 6/1976 | Notomi et al. |
| 4,022,755 A | 5/1977 | Tanigaichi et al. |
| 4,026,913 A | 5/1977 | Tanigaichi et al. |
| 4,039,538 A * | 8/1977 | Klinkenberg ............... 544/219 |
| 4,116,946 A | 9/1978 | Jakob et al. |
| 4,195,132 A | 3/1980 | Sundermann et al. |
| 4,389,516 A | 6/1983 | Sugio et al. |
| 4,528,366 A | 7/1985 | Woo et al. |
| 4,604,452 A | 8/1986 | Shimp |
| 4,709,008 A | 11/1987 | Shimp |
| 4,740,584 A | 4/1988 | Shimp |
| 4,785,075 A | 11/1988 | Shimp |
| 4,849,486 A | 7/1989 | Tsuchiya et al. |
| 4,902,752 A | 2/1990 | Shimp |
| 4,923,912 A | 5/1990 | Sasaki et al. |
| 4,975,319 A | 12/1990 | Walles et al. |
| 4,983,683 A | 1/1991 | Shimp |
| 5,043,367 A | 8/1991 | Hallgren et al. |
| 5,068,309 A | 11/1991 | Shimp et al. |
| 5,141,791 A | 8/1992 | Chao et al. |
| 5,149,863 A | 9/1992 | Shimp et al. |
| 5,213,886 A | 5/1993 | Chao et al. |
| 5,218,030 A | 6/1993 | Katayose et al. |
| 5,352,745 A | 10/1994 | Katayose et al. |
| 5,834,565 A | 11/1998 | Tracy et al. |

OTHER PUBLICATIONS

Chemical Abstracts Record for JP01003223.
Chemical Abstracts Record for JP02055721.
Chemical Abstracts Registry File Record for Pyroguard SR 245.
Chemical Abstracts Record for JP02055722.
Chemical Abstracts Record for JP08003398.

\* cited by examiner

*Primary Examiner*—Philip Tucker
*Assistant Examiner*—D. Aylward

(57) ABSTRACT

A cured composition is the cured residue of a curable composition including (a) an epoxy resin essentially free of bromine atoms, a curing agent for the epoxy resin, (b) a flame retardant additive that is the condensation product of (i) a brominated phenol or a mixture of brominated phenols with (ii) a cyanuric halide; (c) a thermoplastic resin, and (d) a bismaleimide resin. The preferred epoxy resin is a mixture of an epoxy resin with less than 2 glycidyl ether groups per molecule and an epoxy resin that has greater than 2 glycidyl ether groups per molecule. The preferred flame-retardant additive is a brominated heterocyclic compound that preferably is a triazine. The preferred thermoplastic resin is a poly(phenylene ether). The cured composition further including a reinforcement may be used in the manufacture of circuit boards having excellent electrical properties, good solvent resistance, and good thermal expansion characteristics.

27 Claims, No Drawings

CURABLE EPOXY RESIN COMPOSITIONS AND THE CURED RESIDUES THEREOF

CROSS REFERENCE TO RELATED APPLICATIONS

This application is a division of U.S. application Ser. No. 09/393,772, filed Sep. 10, 1999 U.S. Pat. No. 6,387,990.

BACKGROUND OF INVENTION

The present invention relates to curable flame retardant compositions and more particularly to curable epoxy compositions containing a brominated triazine flame retardant additive which compositions are ideally suited for fabricating circuit boards.

Metal-clad boards, particularly such boards for use in fabricating printed circuits, are well-known in the art. The simplest of such boards generally comprises a resinous plastic (polymeric) substrate to which is bonded at least one thin sheet of an electrically conductive material, preferably copper. The resinous plastic substrate can be clad with the metal foil on one or both sides, depending upon the desired use, and can be rigid or flexible depending upon the composition of the resinous plastic substrate, the choice of reinforcement (if any), and the intended use of the board.

A number of polyphenylene ether compositions having favorable dielectric properties and utility in circuit board manufacture are known. However, there is a growing need in the industry for laminates with good thermal performance, solvent resistance, and improved dielectric properties such as dissipation factor and dielectric constant. Due to deficiencies in one or more properties, many such compositions have not attained wide commercial use. Specifically, while polyphenylene ethers are excellent dielectrics, deficiencies often are found in areas such as solvent resistance, flammability, and resistance to high temperatures. Polyphenylene ethers often are combined with polyepoxides in an attempt to improve upon the aforementioned properties, but such combinations have not been found to be wholly satisfactory either.

In addition to excellent dielectric properties, resinous compositions useful in printed circuit board manufacture also should be highly flame-retardant. A V-1 rating, as determined by Underwriters Laboratories test procedure UL-94, is universally required, with V-0 usually being necessary. The V-0 rating requires a flame-out time (FOT) of not more than 10 seconds in any trial and a cumulative FOT of not more than 50 seconds for five samples. As a practical matter, purchasers often mandate a maximum cumulative FOT of 35 seconds.

The fabricated board should not lose substantial weight and its surface should not be appreciably marred by contact with methylene chloride, a solvent commonly used for cleaning. Since connections with the printed circuit typically are made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In preparing rigid metal-clad boards, it is common to form individual lamina, commonly called prepregs, by formulating a resinous binder composition made from epoxy, modified'styrene, or the like. A solvent solution of the resin is placed in an apparatus known as a "dip tank." Continuous webs of reinforcement can be pre-impregnated in the tank and then dried in a vertical or horizontal treating tower or oven. Normally, the resin is partially cured or B-staged after exiting the treater tower or oven. The copper foil, optionally coated with an adhesive, is placed on one side of the prepreg and subjected to heating under pressure to effect a bond between the metal foil and the substrate. Multiple prepregs can be used in forming a single composite board. Additionally, multilayer printed wiring boards will have a number of interposed laminae and copper sheets.

Pressing of the boards can be effected in a press by placing the foil/substrate structure between the platens and closing the press, or a continuous belt can be used. The curing cycle in the press will depend upon the nature and thickness of the laminate, the time and temperature of the cycle being those required to cure the substrate, and the bonding adhesive layer, if present. Sufficient pressure is required to effect adequate flow of the adhesive and/or substrate resins in order to wet-out and bond adequately. The pressure must be sufficient to prevent blistering which is due to the release of gases resulting either from retained volatiles in the substrate or adhesive layers, or resulting from by-products of the curing process.

Japanese patent 64[1988]-3223 describes blends of bisphenol-A diglycidyl ether, TBBPA diglycidyl ether, epoxy phenol novolac and curing agents such as amines. However, the resulting material produces laminates with inferior solvent resistance and is, thus, not suitable from printed circuit board laminates.

Japanese patents Hei 2[1990]-55721 and Hei 2[1990]-55722 describe laminates with improved chemical resistance, comprising (1) a bisphenol poly(glycidyl ether), epoxy novolac, and brominated bisphenol reaction product; (2) a poly(phenylene ether); (3) a novolac resin; (4) a lead salt; and (5) $Sb_2O_3$. However, the resulting trichloroethylene resistance still is not adequate in the cured product, and surface roughening is observed.

Walles et al. (U.S. Pat. No. 4,975,319) describe compositions comprising (1) a bisphenol poly(glycidyl ether), epoxy novolac, and brominated bisphenol reaction product; (2) a poly(phenylene ether); (3) a novolac resin, curing agents, and hardeners that produce laminates with dissipation factors in the range of 0.011–0.016.

Haligren et al. (U.S. Pat. No. 5,043,367) describes (1) poly(phenylene ether); (2) halogenated bisphenol diglycidyl ether non-halogenated diglycidyl ether, and various curing agents which produce solvent resistant laminates having dissipation factors in the range of 0.011–0.013.

Katayose et al. (U.S. Pat. No. 5,218,030) describes the use of (i) a poly (phenylene ether) containing pendant allyl or propargyl groups; (ii) triallylcyanurate or triallylisocyanurate; and optionally (iii) a flame retardant; or (iv) an antimony-containing auxiliary flame retardant.

Katayose et al. (U.S. Pat. No. 5,352,745) disclose compositions with improved solvent resistance comprising a high molecular weight functionalized poly(phenylene ether) resin ($\eta$=0.30–0.56 IV PPO) produced through reactive extrusion of poly (phenylene ether) with maleic anhydride. Formulation of (i) the reaction product of poly(phenylene ether) (PPE) with an unsaturated acid or acid anhydride with, (ii) triallylcyanurate or triallylisocyanurate, (iii) a brominated epoxy resin, (iv) novolac resins, and (v) a cure catalyst, produces flame retardant and solvent resistant resins useful in the production of printed circuit boards. This patent shows that a portion of the amino functionalized end groups contain capping residues. The skilled artisan would recognize that such end groups would comprise less than 10% of the hydroxyl end groups and would not be sufficient to significantly accelerate the cure rate of an allylic thermoset.

Chao et al. (U.S. Pat. No. 5,213,886) describe blends of low molecular weight poly(phenylene ether) compounds and epoxy resins. Tracy et al. (U.S. Pat. No. 5,834,565) describe blends of low molecular weight poly(phenylene ether) compounds in thermosetting matrices such as epoxy resins and unsaturated polyesters. These thermosetting compositions exhibit improved processability over analogous compositions containing high molecular weight poly(phenylene ether) compounds.

None of the foregoing art discloses the present flame-retardant blends that display excellent electrical properties, good solvent resistance, and good thermal expansion characteristics.

SUMMARY OF INVENTION

A curable composition is formulated from an epoxy resin; a flame retardant additive essentially free of phenolic groups and epoxy groups preferably having toluene solubility of greater than 15 g/100 ml toluene at 50° C.; and a thermoplastic resin. The preferred epoxy resin component comprises an epoxy resin or mixture of epoxy resins that have on average greater than 2 glycidyl ether groups per molecule. The preferred flame-retardant additive is a brominated triazine compound. The preferred thermoplastic resin is a resin having a Tg greater than 130° C. and most preferably a poly(phenylene ether).

The inventive curable compositions advantageously can be combined with reinforcement in the manufacture of circuit boards having excellent electrical properties, good solvent resistance, and thermal properties.

DETAILED DESCRIPTION

The present invention includes flame retardant and solvent resistant laminates with excellent thermal and dielectric properties ideally suited for electrical laminates. Such compositions comprise (a) an epoxy resin and curing agent therefor; (b) a flame-retardant additive essentially devoid of epoxy groups and of phenolic groups; and (c) a thermoplastic resin.

The epoxy resin component comprehends molecules containing one or more oxirane ring groups. Useful epoxy resins include, for example, glycidyl ethers, partial reaction products of glycidyl ethers with phenols (either monomeric or polymeric), or cycloaliphatic epoxies. Epoxy resins useful in the present invention include those described in *Chemistry and Technology of the Epoxy Resins;* Ellis, B. Ed.; Blackie Academic & Professional imprint of Chapman & Hall: London (1993). Preferred epoxies include, for example, multifunctional glycidyl ethers exemplified by epoxidized phenol-formaldehyde novolacs, epoxidized cresol-formaldehyde novolacs and other epoxidized alkylphenol-formaldehyde novolacs, epoxidized 1,1,1-tris(4-hydroxyphenyl)ethane, epoxidized 1,1,2,2-tetra(4-hydroxyphenyl) ethane, epoxidized phenol-dicyclopentadiene novolacs, and epoxidized phenol-benzaldehyde novolacs. Preferably, the epoxy resin component is essentially free of bromine atoms. This means that the epoxy resin component has less than a 1% bromine atom content.

Useful catalysts/curing agents for the epoxy resin component include those described by B. Ellis in *Chemistry and Technology of The Epoxy Resins,* Chapman and Hall, New York, N.Y. (1993) and also in U.S. Pat. Nos. 5,141,791, 4,923,912, and 4,849,486, the disclosures of which are expressly incorporated herein by reference. Catalysts effective as curing agents for epoxy resins, such as, for example, imidazoles, may be utilized in the practice of the invention. Particularly useful imidazoles include, for example, imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl)-2-phenylimidazole. Preferred imidazoles include, for example, 1,2-dimethylimidazole and 2-heptadecylimidazole. Particularly preferred in the practice of the present invention, however, is a catalyst package formed from a dicyanadiamide, benzyldimethylamine, and 2-methylimidazole. For present purposes, catalysts for cure of the epoxy resin are included within the term "curing agent". That is, a catalyst can be a curing agent.

Brominated heterocyclic compounds useful in the present invention include any compound containing both bromine groups and a heterocyclic moiety, such as, for example, triazine, pyrrole, or oxidized derivatives thereof. Preferred brominated heterocyclic compounds are brominated triazines. Such compounds often are prepared by the condensation of a brominated phenol or mixture of brominated phenols with a cyanuric halide, such as cyanuric chloride, most often in the presence of a basic catalyst. The most preferred brominated triazines are those represented by structures (I) and (II), below, where structure (I) corresponds to 2,4,6-tris(2,4,6-tribromophenoxy)-1,3,5-triazine (Chemical Abstracts Registry No. 25713-60-4), and structure (II) corresponds to 2,2'-[(1-methylethylidene)bis[(2,6-dibromo-4,1-phenylene)oxy]]bis[4,6-bis[(2,4,6-tribromophenyl)oxy]-1,3,5-triazine (Chemical Abstracts Registry No. 329736-04-1).

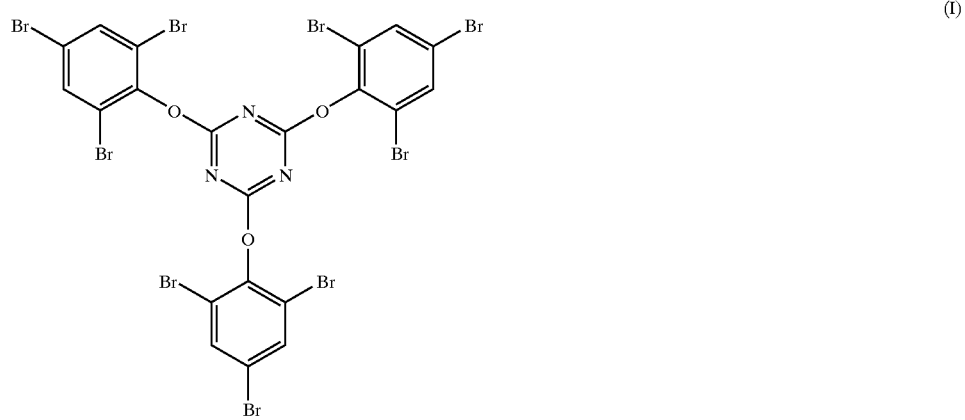

(I)

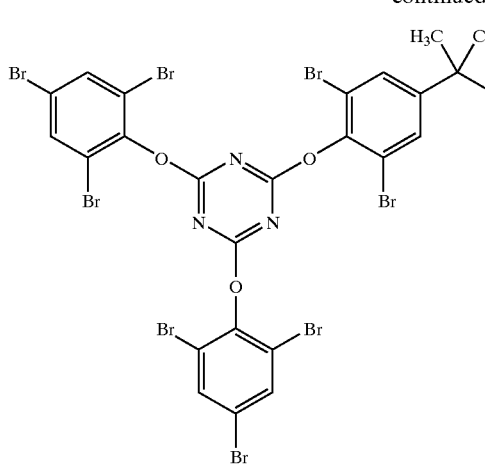 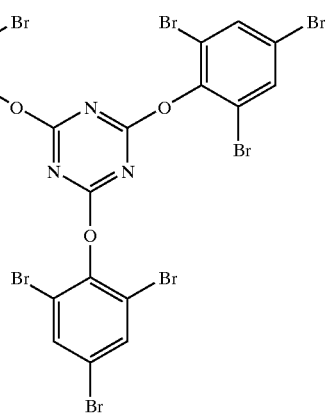

(II)

The flame retardant additive is essentially free of phenolic groups and of epoxy (oxirane) groups. This means that the flame retardant additive contains less than 1 wt-% phenolic group or epoxy group content.

Thermoplastic compounds useful in the inventive curable composition include those having Tg's greater than 120° C. because thermoplastics with lower Tg's have deleterious effect on the thermal performance of the cured composition. Representative of such preferred thermoplastic compounds include, for example, poly (phenylene ether) compounds, polyimides, and poly(styrene-co-maleic anhydride). Poly(phenylene ether) resins are commercially available as blends with homopolystyrene (Tg=100° C.) and as such are not suitable for the present invention because of the deleterious effects of the low Tg resin on thermal properties of the laminate. Thus, the present curable compositions are essentially free of styrene homopolymers, i.e., contain less than 1 wt-% styrene homopolymer content.

Poly(phenylene ether) compounds are the most preferred thermoplastic compounds for use in the novel curable composition and include all known poly (phenylene ether) compounds, poly(phenylene ether) copolymers, and derivatized poly (phenylene ether) resins synthesized therefrom. Poly(phenylene ether) compounds are described in the art in numerous patents and references, and generally contain recurring units of the following structure, (III)

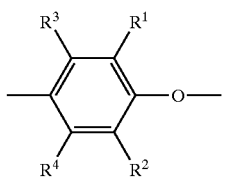

(III)

wherein $R^{1-4}$ independently are hydrogen; alkyl, alkenyl; alkynyl; aryl; mixed alkyl-, alkenyl-, or alkynyl-aryl hydrocarbons, and such groups optionally containing a substituent selected from one or more of a carboxylic acid, an aldehyde, an alcohol, and an amino substituent.

Useful copolymers include oxidative polymerization products of 2,6-dimethylphenol and 2,3,6-trimethylphenol. Derivatized resins include, for example, poly(phenylene ether) compounds containing pendant allylic, propargylic radicals, or end-group derivatized resins formed through, for example, reaction of the terminal hydroxyl groups of the poly(phenylene ether) with an acid chloride, ester, or anhydride. Typical of end-group derivatized resins are the reaction products of a poly (phenylene ether) with trimellitic anhydride acid chloride, methacrylic anhydride, or acrylic anhydride. Derivatized resins also include the reaction products produced by reaction of a poly(phenylene ether) with an unsaturated acid, anhydride, or a hydroxylated acid or anhydride which are most optimally prepared in the polymer melt by process such as by extrusion at temperatures of between about 200°–350° C. Exemplary reactants for such melt extrusion process include unsaturated acid, anhydride, or a hydroxylated acid or anhydride including maleic anhydride, maleic acid, citric acid, malic acid, and the like.

Preferred poly(phenylene ether) compounds for use in the present invention include low molecular weight poly (phenylene ether) compounds having number average molecular weights from about 1,000 to 10,000 g/mol, or weight average molecular weight of from about 3,000 to 35,000 g/mol. Such materials may be prepared by using oxidative polymerization of alkylated phenols by known procedures. Alternatively, these materials may be prepared by the reaction of a high molecular poly(phenylene ether) with a peroxide and a phenol, or with a peroxide alone. In a preferred embodiment, a high molecular weight poly (phenylene ether) with a number average molecular weight of about 45,000 g/mol is reacted in a toluene solution at about 50°–90° C. with benzoyl peroxide and bisphenol-A. Such low molecular weight polymers may be isolated by precipitation in anon-solvent, such as methanol, or more preferably by volatilization of the solvent and melt extrusion of the resulting polymer at temperatures from about 200°–300° C.

When using the preferred thermoplastic resin, poly (phenylene ether), it is advantageous to use a flame retardant additive that is mutually soluble in an aromatic hydrocarbon solvent, which preferably is toluene. The minimum amount of flame retardant required to achieve UL-94 V-0 flammability rating often is less than 30 parts by weight of the total composition. The preferred brominated flame retardants should have good solubility in aromatic hydrocarbon solvent of choice, say toluene, at temperatures below about 50° C. Generally, a solubility of 15 g/100 ml toluene at 50° C. is sufficient. Because of such toluene solubility, the preferred flame retardant resin compositions can be prepared as homogeneous solutions, which allows for uniform impregnation of a fibrous reinforcement. Thus, it is highly advantageous in the practice of the present invention to use toluene soluble brominated flame retardant additives with a poly(phenylene ether) thermoplastic compound, the epoxy resin and curing agents and catalysts therefor, in a toluene solvent or a mixture of solvents which contain greater than 50% by weight toluene, advantageously 80% by weight toluene, and preferably 100% toluene.

Other thermosetting resins optionally may be blended with the epoxy resin component in forming the curable composition disclosed herein including, for example, cyanate esters, bismaleimides, and unsaturated polyesters. Such thermosetting resins are known to the art and are disclosed in, for example, U.S. Pat. Nos. 4,604,452, 4,785,075, 4,902, 752, 4,983,683, 5,068,309, and 5,149,863.

Cyanate esters useful in the present invention include, for example, those that could be formed by replacement of glycidyl groups(—$CH_2CHOCH_2$) of epoxy resins with —CN groups. Useful cyanate ester compounds include, but are not limited to the following: 1,3- and 1,4-dicyanatobenzene; 2-tert-butyl-1,4-dicyanatobenzene; 2,4-dimethyl-1,3-dicyanatobenzene; 2,5-di-tert-butyl-1,4-dicyanatobenzene; tetramethyl-1,4-dicyanatobenzene; 4-chloro-1,3-dicyanatobenzene; 1,3,5-tricyanatobenzene; 2,2'- and 4,4'-dicyanatobiphenyl; 3,3',5,5'-tetramethyl-4,4'-dicyanatobiphenyl; 1,3-, 1,4-, 1,5-, 1,6-, 1,8-, 2,6-, and 2,7-dicyanatonaphthalene; 1,3,6-tricyanatonaphthalene; bis (4-cyanatophenyl)methane; bis(3-chloro-4-cyanatophenyl) methane; bis(3,5-dimethyl-4-cyanatophenyl)methane; 1,1-bis(4-cyanatophenyl)ethane; 2,2-bis(4-cyanatophenyl) propane; 2,2-bis(3,3-dibromo-4-cyanatophenyl)propane; 2,2-bis(4-cyanatophenyl)-1,1,1,3,3,3-hexafluoropropane; bis(4-cyanatophenyl)ester; bis(4-cyanatophenoxy)benzene; bis(4-cyanatophenyl) ketone; bis(4-cyanatophenyl) thioether; bis(4-cyanatophenyl)sulfone; tris(4-cyanatophenyl)phosphate, and tris(4-cyanatophenyl) phosphate.

Also useful are cyanic acid esters derived from phenolic resins, e.g., as disclosed in U.S. Pat. No. 3,962,184; cyanated novolac resins derived from novolac, e.g., as disclosed in U.S. Pat. No. 4,022,755; cyanated bis-phenol-type polycarbonate oligomers derived from bisphenol-type polycarbonate oligomers, e.g., as disclosed in U.S. Pat. No. 4,026, 913; cyano-terminated polyarylene ethers, e.g., as disclosed in U.S. Pat. No. 3,595,900; dicyanate esters free of ortho hydrogen atoms, e.g., as disclosed in U.S. Pat. No. 4,740, 584; mixtures of di- and tricyanates, e.g., as disclosed in U.S. Pat. No. 4,709,008; polyaromatic cyanates containing polycyclic aliphatic groups, e.g., as disclosed in U.S. Pat. No. 4,528,366, e.g., QUARTEX™ 7187, available from Dow Chemical Company (Midland, Mich.); fluorocarbon cyanates, e.g., as disclosed in U.S. Pat. No. 3,733,349; and cyanates, e.g., as disclosed in U.S. Pat. Nos. 4,195,132 and 4,116,946, all of the foregoing patents being expressly incorporated herein by reference.

Polycyanate compounds obtained by reacting a phenolformaldehyde precondensate with a halogenated cyanide also may be useful for present purposes. Examples of preferred cyanate ester resin compositions include low molecular weight ($M_n$) oligomers, e.g., from about 250 to about 5000, e.g., bisphenol-A dicyanates such as AroCy™ "B-30 Cyanate Ester Semisolid Resin"; low molecular weight oligomers of tetra o-methyl bis-phenol F dicyanates, such as "AroCy™; M-30 Cyanate Ester Semisolid Resin"; low molecular weight oligomers of thiodiphenol dicyanates, such as AroCy™ "T-30", all of the foregoing being commercially available from Ciba-Geigy Corp., Hawthorne, N.Y.

Bismaleimide resins include, for example, resins derived from aromatic diamines, such as those described in U.S. Pat. No. 4,389,516. Generally, bismaleimides are synthesized, for example, by reacting a diluted ether solution of a diamine to a similar diluted ether solution of maleic anhydride to form a maleamic acid, which can be disposed in acetic anhydride and converted to the corresponding bismaleimide in the presence of potassium acetate (see U.S. Pat. No. 2,444,536).

Bismaleimide resins, such as those described in U.S. Pat. No. 4,389,516, include polyfunctional maleimides having the formula

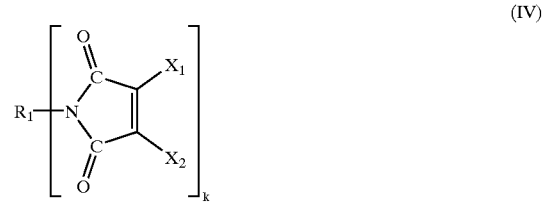

(IV)

wherein k is an integer of at least 2, $X_1$ and $X_2$ are identical or different and each represents a hydrogen atom, a halogen atom or a lower alkyl group, $R.sub.1$ represents an aromatic or aliphatic organic group having a valence of k.

The important structure in the polyfunctional maleimides which is conducive to the achievement of the objects of this invention is that the polyfunctional maleimides have at least two maleimide groups represented by the parenthesized portion of formula (IV).

In formula (IV), $X_1$ and $X_2$, independently from each other, represent a hydrogen atom, a halogen atom or a lower alkyl group. The halogen atom is preferably chlorine or bromine. The lower alkyl group is preferably an alkyl group having 1 to 4 carbon atoms such as methyl, ethyl, n-propyl, iso-propyl or n-butyl.

$R_1$ in formula (IV) is an aromatic or aliphatic polyvalent organic group. The valence of the organic group is equal to the value of k which is usually from 2 to 10, preferably 2 to 4. The aliphatic polyvalent organic group is preferably a liner or cyclic aliphatic hydrocarbon group having 4 to 16 carbon atoms. Examples of the aromatic polyvalent organic group are polyvalent (preferably divalent) monocyclic or fused ring aromatic hydrocarbon groups such as a benzene ring, a naphthalene ring an anthracene ring, or a pyrene ring; pol,yvalent polybenzene groups resulting from bonding of a plurality of benzene rings either directly or through a bridging member, represented by the formulbridging member, represented by the formula

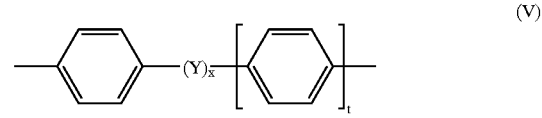

(V)

wherein x represents 0 or 1, and when x represents 1, Y represents a di or tri valent bridging member, preferably divalent bridging member, for example a linear, branched or cyclic aliphatic hydrocarbon group having 1 to 14 carbon atoms, a phenylene group, a xylylene group, an oxygen atom, a sulfur atom, a carbonyl group, a sulfonyl group, a sulfinyl group, an alkyleneoxyalkylene group a phosphonyl group, a phosphinyl group or an imino group, and t is an integer of or 2; a triazine ring; and a residue obtained by removing the amino group from a polynuclear product of benzene, preferably a binuclear to decanuclear product of benzene, which is a condensation product between aniline and formaldehyde. In $R_1$ of formula (IV) the linear aliphatic hydrocarbon group may be replaced by an inert substituent, for example, an alkoxy group, preferably having 1 to 4 carbon atoms, and the cyclic aliphatic or aromatic hydrocarbon group and a polybenzene group may be replaced by an alkyl group preferably having 1 to 4 carbon atoms, or an alkoxy group preferably having 1 to 4 carbon atoms.

To avoid complexity in expression, specific examples of $R_1$ are expressed in terms of compounds representing the basic structure. They include diphenylmethane, diphenylpropane, diphenyl ether, diphenyldimethylene ether, diphenyl thioether, diphenylketone, diphenylamine, diphenyl sulfoxide, diphenylsulfone, triphenyl phosphite, and triphenyl phosphate. Specific examples of the aliphatic polyvalent organic group will be self-evident.

Generally, compositions of this invention comprising the polyfunctional maleimides of general formula (IV) in which $R_1$ is an aliphatic group impart flexibility or suppleness to the resulting cured resins, and compositions of this invention comprising the polyfunctional maleimide of general formula (IV) in which $R_1$ is an aromatic group impart excellent heat resistance to the cured resins. The compounds of general formula (IV) may be used singly or as a mixture of two or more in the resin composition of this invention.

Preferably, there are used in this invention polyfunctional maleimides of the following formula (VI)

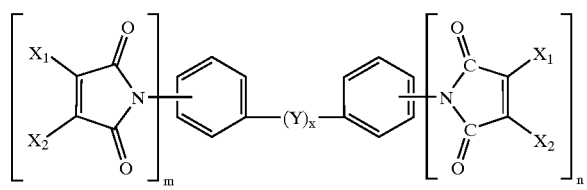

wherein $X_1$, $X_2$ and $(Y)_x$ are as defined hereinabove, and m+n is equal to k which is an integer of 2 to 10.

Polyfunctional maleimides of formula (VI) in which x represents 0 or 1 and when x represents 1, Y represents a methylene group are preferred, and those of formula (VI) in which, x represents 0 or 1 and when x represents 1, Y represents a methylene group and m and n are 1, are especially preferred.

These polyfunctional maleimides can be produced by a method known per se which comprises reacting a maleic acid with a polyamine having at least two amino groups to prepare a polymaleamide acid, and then dehydrocyclizing the polymaleamide acid.

Examples of the polyamines used to prepare the polyfunctional maleimides of formula (IV) include m- or p-phenylenediamine, m- or p-xylylene diamine, 1,4- or 1,3-cyclohexanediamine, hexahydroxylylenediamine, 4,4'-diaminobiphenyl, bis(4-aminophenyl)methane, bis(4-aminophenyl)ether, bis(4-aminophenyl)sulfone, bis(4-amino-3-methylphenyl)methane, bis(4-amino-3,5-dimethylphenyl)methane, bis(4-amino-3-chlorophenyl) methane, bis(4-aminophenyl)cyclohexane, 2,2-bis(4-aminophenyl)propane, 2,2-bis(4-amino-3-methylphenyl) propane, 2,2-bis(3,5-dibromo-4-aminophenyl)propane, bis (4-aminophenyl)phenylmethane, 3,4-diaminophenyl-4'-aminophenylmethane, 1,1-bis(4-aminophenyl) phenylethane, melamine having an s-triazine ring, and a polynuclear polyamine obtained by reacting aniline with formaldehyde to bond the benzene rings by a methylene linkage.

In the known methods for preparing the polyfunctional maleimides, the use of a primary amine such as those shown above as the polyamine results in desirable proceeding of the reaction.

The composition of this invention may contain the polyfunctional maleimide in the form of a prepolymer. The prepolymer denotes a pre-homopolymer, a pre-copolymer or an amine-modified prepolymer obtained by a method known per se which comprises reacting at least one polyfunctional maleimide under heat, if desired together with a polyamine having at least two amino groups in the molecule, and stopping it before the reaction mixture is gelled.

Reinforcements known to one skilled in the art can be used, including but not limited to, inorganic and organic materials, such as woven or non-woven glass fabrics of the E-, NE-, S-, T- and D-type glasses and quartz, and the like. They may be in the form of glass roving cloth, glass cloth, chopped glass, hollow glass fibers, glass mat, glass surfacing mat, and non-woven glass fabric, ceramic fiber fabrics, and metallic fiber fabrics. In addition, synthetic organic reinforcing fillers may also be used in the present invention including, for example, organic polymers capable of forming fibers. Illustrative examples of such reinforcing organic fibers include, for example, poly (ether ketone), polyimide benzoxazole, poly(phenylene sulfide), polyesters, aromatic polyamides, aromatic polyimides or polyetherimides, acrylic resins, and poly(vinyl alcohol). Fluoropolymers such as polytetrafluoroethylene, can be used in the present invention. Also included as reinforcement are natural organic fibers known to those skilled in the art, including cotton cloth, hemp cloth, felt, carbon fiber fabrics, and natural cellulosic fabrics such as Kraft paper, cotton paper; and glass fiber containing paper. Such reinforcing fillers may be provided in the form of monofilament or multifilament fibers and could be used either alone or in combination with another type of fiber, through, for example, co-weaving or core/sheath, side-by-side, orange-type or matrix and fibril constructions, or by other methods known to one skilled in the art of fiber manufacture. Such fillers could be supplied in the form of, for example, woven fibrous reinforcements, non-woven fibrous reinforcements, or papers.

Coupling agents, incorporated into the reinforcing material, are known in the art to improve adhesion of the fibrous reinforcement to the cured resin composition. For the purposes of the present invention, representative coupling agents include, for example, silane-, titanate-, zirconate-, aluminum-, and zircoaluminum-based coupling agents, as well as other agents known to those skilled in the art.

Among the other materials that may be present are inert, particulate fillers such as talc, clay, mica, silica, alumina, and calcium carbonate. Fabric wettability enhancers (e.g. wetting agents and coupling agents) and polar liquids such as n-butyl alcohol, methyl ethyl ketone, polysiloxanes, and tetrahydrofuran, may be advantageous under certain conditions. Such materials as antioxidants, thermal and ultraviolet stabilizers, lubricants, antistatic agents, dyes, and pigments also may be present.

The curable compositions of the invention are dissolved in an effective amount of an inert organic solvent, typically to a solute content of about 30%–60% by weight. The identity of the solvent is not critical, provided it may be removed by suitable means such as evaporation. Examples of suitable solvents include aromatic hydrocarbons, such as toluene or xylene, cycloaliphatic ethers such as tetrahydrofuran, chlorinated hydrocarbons such as chloroform, amides such as dimethylformamides, or mixtures of the above solvents with an aromatic or chlorinated hydrocarbon, ketone, ether, amide other solvent known to the art. Aromatic hydrocarbons, especially toluene, are useful in the preferred embodiment where the thermoplastic resin is a poly(phenylene ether). The order of blending and dissolution also is not critical; however, in order to avoid premature curing, catalyst and curing agent (hardener) components generally should not be brought initially into contact with polyphenylene ether and polyepoxides at a temperature below about 50° C. Proportions of components and bromine herein do not include solvent.

In this application all amounts and proportions are by weight and units are in the metric system, unless otherwise indicated. Also, all citations referred to herein are expressly incorporated herein by reference.

EXAMPLE

Poly(phenylene ether) resin ($\eta=0.12$ dl/g) was prepared by reacting a 0.40 IV PPO resin (100 parts) in toluene (300 parts) with benzoyl peroxide (4 parts) and bisphenol-A (4 parts) at 80° C. The resin was then isolated from solution by precipitation into methanol followed by filtration and drying at 80° C. overnight in vacuo. The resulting poly(phenylene ether) resin (Mn=4,329; Mw=12,801) was dissolved in toluene to which was added various epoxy resins, brominated triazine flame retardant additive, and curing catalysts to a solids content of 50% by weight. Glass fabric (7628 style E-glass) was then impregnated with the resin solution and the resulting impregnated glass cloth heated at 180° C. to remove the excess solvent and partially cure the thermoset resin. Eight of these partially cured, glass reinforced articles or prepregs then were layered and cured at 200° C. for 3 hours to generate the resulting laminate. As shown below a flame retardant laminate with acceptable thermal properties and low dissipation factor and dielectric constant may be produced in this manner, making them useful for printed circuit board applications.

TABLE 1

| Formulation | Weight-Parts |
| --- | --- |
| Component 1 | |
| PPE (0.13 IV) | 26.3 |
| Component 2 | |
| Tris(2,4,6-tribromophenoxytriazine); (1) | 26.3 |
| Component 3 | |
| Epoxidized cresol formaldehyde novolac | 43.8 |
| Component 4 | |
| Zinc Octoate | 3.5 |
| 2-ethly-4-methyl imidazole(2,4-EMI) | 0.1 |
| Properties: | |
| Tg (TMA, ° C.) | 131 |
| Laminate Integrity | Good |
| MeCl$_2$ resistance (30 min, RT) | Good |
| CTE (below Tg; TMA) | 54 |
| CTE (above Tg; TMA) | 319 |
| Z-axis expansion (%) | 5.4% |
| UL-94 | V-0 |
| Dielectric Constant (1 MHz) | 4.37 |
| Dissipation Factor (1 MHz) | 0.0039 |

What is claimed is:

1. A curable composition comprising:
   (a) an epoxy resin and curing agent therefor, wherein said epoxy resin is essentially free of bromine atoms;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin; and
   (d) a bismaleimide.

2. The curable composition of claim 1, wherein said flame retardant additive has a bromine content greater than 20%.

3. The curable composition of claim 1, wherein said flame retardant additive is 1,3,5-tris(2,4,6-tribromophenoxy) triazine.

4. The curable composition of claim 1, wherein said flame retardant additive is 2,2'-[(1-methylethylidene)bis[(2,6-dibromo-4,1-phenylene)oxy]]bis[4,6-bis[(2,4,6-tribromophenyl)oxy]-1,3,5-triazine].

5. The curable composition of claim 1, wherein said flame retardant additive is soluble in toluene at a concentration of greater than 15 g/100 ml of toluene at a temperature of 50° C.

6. A curable composition comprising:
   (a) an epoxy resin and curing agent therefor, wherein said epoxy resin is essentially free of bromine atoms; and wherein said epoxy resin is a glycidyl ether resin or a mixture of glycidyl ether resins containing, on average, greater than 2 epoxy groups per molecule;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin; and
   (d) a bismaleimide.

7. A curable composition comprising:
   (a) an epoxy resin and curing agent therefor, wherein said epoxy resin is essentially free of bromine atoms; and wherein said epoxy resin is a mixture of
      (a1) an epoxy resin containing on average less than or equal to 2 glycidyl groups per molecule; and
      (a2) an epoxy resin containing greater than 2 glycidyl groups per molecule;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin; and
   (d) a bismaleimide.

8. A curable composition comprising:
   (a) an epoxy resin and curing agent therefor, wherein said epoxy resin is essentially free of bromine atoms;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin; wherein said thermoplastic resin has a Tg greater than 120° C.; and
   (d) a bismaleimide.

9. A curable composition comprising:
   (a) an epoxy resin and curing agent therefor, wherein said epoxy resin is essentially free of bromine atoms;
   (b) a flame retardant additive essentially free of phenolic groups and of epoxy groups, wherein said flame retardant is a condensation product of (i) a brominated phenol or a mixture of brominated phenols with (ii) a cyanuric halide;
   (c) a thermoplastic resin; wherein said thermoplastic resin has a dissipation factor of less than 0.010 measured at 1 MHz at room temperature; and
   (d) a bismaleimide.

10. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin has been directly isolated from solution after polymerization; and
(d) a bismaleimide.

11. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a poly(phenylene ether); and
(d) a bismaleimide.

12. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a poly(phenylene ether); and wherein said poly(phenylene ether) has a weight average molecular weight ranging from about 3,000 to 35,000 g/mol; and
(d) a bismaleimide.

13. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a poly(phenylene ether); and wherein said poly(phenylene ether) has a number average molecular weight ranging from about 1,000 to 10,000 g/mol; and
(d) a bismaleimide.

14. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a poly(phenylene ether); and wherein said poly(phenylene ether) has been melt processed at a temperature ranging from about 200° C. to 350° C.; and
(d) a bismaleimide.

15. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a poly(phenylene ether); and wherein said poly(phenylene ether) is hydroxy functional; and
(d) a bismaleimide.

16. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is one or more of a poly(phenylene ether) or a poly(styrene-co-maleic anhydride); and
(d) a bismaleimide.

17. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a reaction product of a poly(phenylene ether) and a peroxide; and
(d) a bismaleimide.

18. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a reaction product of a poly(phenylene ether), a peroxide, and a bisphenol; and
(d) a bismaleimide.

19. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;
(c) a thermoplastic resin; wherein said thermoplastic resin is a polyimide; and
(d) a bismaleimide.

20. A curable composition comprising:
(a) an epoxy resin and curing agent therefor, wherein said epoxy resin is essentially free of bromine atoms;
(b) a flame retardant additive essentially free of phenolic groups and of epoxy groups, wherein said flame retardant is a condensation product of (i) a brominated phenol or a mixture of brominated phenols with (ii) a cyanuric halide;

(c) a thermoplastic resin;

(d) a bismaleimide; and one or more of an organic reinforcement, an inorganic reinforcement, or a filler.

21. The curable composition of claim 1, wherein the curable composition is essentially free of homopolymers of styrene.

22. A curable composition comprising:

(a) an epoxy resin and curing agent therefor, wherein said epoxy resin is essentially free of bromine atoms; and wherein the epoxy resin is a multifunctional glycidyl ether;

(b) a flame retardant additive essentially free of phenolic groups and of epoxy groups, wherein said flame retardant is a condensation product of (i) a brominated phenol or a mixture of brominated phenols with (ii) a cyanuric halide;

(c) a thermoplastic resin; and (d) a bismaleimide.

23. A curable composition comprising:

(a) an epoxy resin and curing agent therefor, wherein the epoxy resin is essentially free of bromine atoms; wherein the epoxy resin is a multifunctional glycidyl ether; and wherein the multifunctional glycidyl ether is selected from the group consisting of epoxidized phenol-formaldehyde novolacs, epoxidized cresol-formaldehyde novolacs, epoxidized alkylphenol-formaldehyde novolacs, epoxidized 1,1,1-tris(4-hydroxyphenyl)ethane, epoxidized 1,1,2,2-tetra(4-hydroxyphenyl) ethane, epoxidized phenol-dicyclopentadiene novolacs, and epoxidized phenol-benzaldehyde novolacs;

(b) a flame retardant additive essentially free of phenolic groups and of epoxy groups, wherein the flame retardant is a condensation product of (i) a brominated phenol or a mixture of brominated phenols with (ii) a cyanuric halide;

(c) a thermoplastic resin; and (d) a bismaleimide.

24. A curable composition comprising:

(a) an epoxy resin and curing agent therefor, wherein the epoxy resin is essentially free of bromine atoms;

(b) a flame retardant additive essentially free of phenolic groups and of epoxy groups, wherein said flame retardant is a condensation product of (i) a brominated phenol or a mixture of brominated phenols with (ii) a cyanuric halide;

(c) a thermoplastic resin; and (d) a bismaleimide; wherein said bismaleimide has the formula

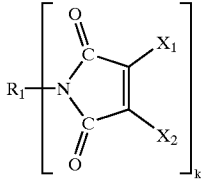

(IV)

wherein k is an integer of at least 2; $X_1$ and $X_2$ are identical or different and each represents a hydrogen atom, a halogen atom or a lower alkyl group; and $R_1$ represents an aromatic or aliphatic organic group having a valence of k, which is selected from the group consisting of a linear or cyclic aliphatic hydrocarbon group having 4 to 16 carbon atoms, a monocyclic or fused ring aromatic hydrocarbon group, a triazine ring, a moiety resulting from the removal of the amino group from a condensation product of aniline and formaldehyde and a polybenzene group represented by the following formula:

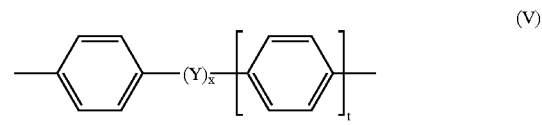

(V)

wherein x represents 0 or 1 and when x represents 1, Y represents a linear, branched or cyclic aliphatic hydrocarbon group having 1 to 14 carbon atoms, a phenylene group, a xylylene group, an oxygen atom, a sulfur atom, a carbonyl group, a sulfonyl group, a sulfinyl group, an alkyleneoxyalkylene group, a phosphonyl group, a phosphinyl group, or an imino group; and t is an integer of 1 or 2, or the homoprepolymer thereof obtained by reacting at least one of said polyfunctional maleimides under heat and stopping the reaction before the reaction mixture is gelled.

25. A curable composition comprising:

(a) an epoxy resin and curing agent therefor, wherein said epoxy resin is a glycidyl ether resin or mixture of glycidyl ether resins containing, on average, greater than 2 epoxy groups per molecule;

(b) 1,3,5-tris(2,4,6-tribromophenoxy)triazine and/or 2,2'-[(1-methylethylidene)bis[(2,6-dibromo-4,1-phenylene)oxy]]bis[4,6-bis[(2,4,6-tribromophenyl)oxy]-1,3,5-triazine];

(c) a poly(phenylene ether) resin; and (d) a bismaleimide.

26. A curable composition comprising:

(a) an epoxidized cresol-formaldehyde novolac resin;

(b) 1,3,5-tris(2,4,6-tribromophenoxy)triazine; and (c) a poly(phenylene ether) resin having a number average molecular weight ranging from about 1,000 to 15,000 g/mol; and (d) a bismaleimide.

27. A cured composition comprising a cured residue of a curable composition comprising:

(a) an epoxy resin and curing agent therefor, wherein said epoxy resin is essentially free of bromine atoms;

(b) a flame retardant additive essentially free of phenolic groups and of epoxy groups, wherein said flame retardant is a condensation product of (i) a brominated phenol or a mixture of brominated phenols with (ii) a cyanuric halide;

(c) a thermoplastic resin; and (d) a bismaleimide.

* * * * *